United States Patent [19]
Jeon

[11] Patent Number: 5,977,488
[45] Date of Patent: Nov. 2, 1999

[54] PRINTED CIRCUIT BOARD HAVING COORDINATE VALUES OF ELECTRONIC COMPONENTS TO BE MOUNTED THEREON AND A METHOD OF NUMBERING THE ELECTRONIC COMPONENTS THEREON

[75] Inventor: Seung Won Jeon, Kyungsangbuk-Do, Rep. of Korea

[73] Assignee: LG Electronics, Inc., Rep. of Korea

[21] Appl. No.: 08/565,162

[22] Filed: Nov. 30, 1995

[30] Foreign Application Priority Data

Nov. 30, 1994 [KR] Rep. of Korea ............... 94-31929

[51] Int. Cl.⁶ .................. H05K 1/02; H05K 3/00
[52] U.S. Cl. ................................ 174/250; 360/748
[58] Field of Search ...................... 174/250, 254, 174/257, 266; 29/426.1, 846; 361/729, 748, 777; 273/260

[56] References Cited

U.S. PATENT DOCUMENTS 3,621,116  11/1971  Adams ............................ 174/254
4,330,684  5/1982   Hayward ......................... 174/254

FOREIGN PATENT DOCUMENTS 1126954    4/1962   Germany .......................... 174/254
4-283983  10/1992   Japan .
5-167219   7/1993   Japan .
0468770    3/1969   Switzerland ...................... 174/254

*Primary Examiner*—Hyung-Sub Sough
*Attorney, Agent, or Firm*—Fish & Richardson P.C.

[57] ABSTRACT

A method of numbering an electronic component to be mounted on a printed circuit board (PCB). According to the method, the PCB is divided into a plurality of sections, X-Y coordinate values are allocated to each of the sections, and the allocated coordinate values are printed in the corresponding section. The electronic component number is determined and printed on the PCB in a format of "type of the component—classification of the component—X-Y coordinate values of the corresponding section—serial number of the component".

7 Claims, 2 Drawing Sheets

F I G. 3
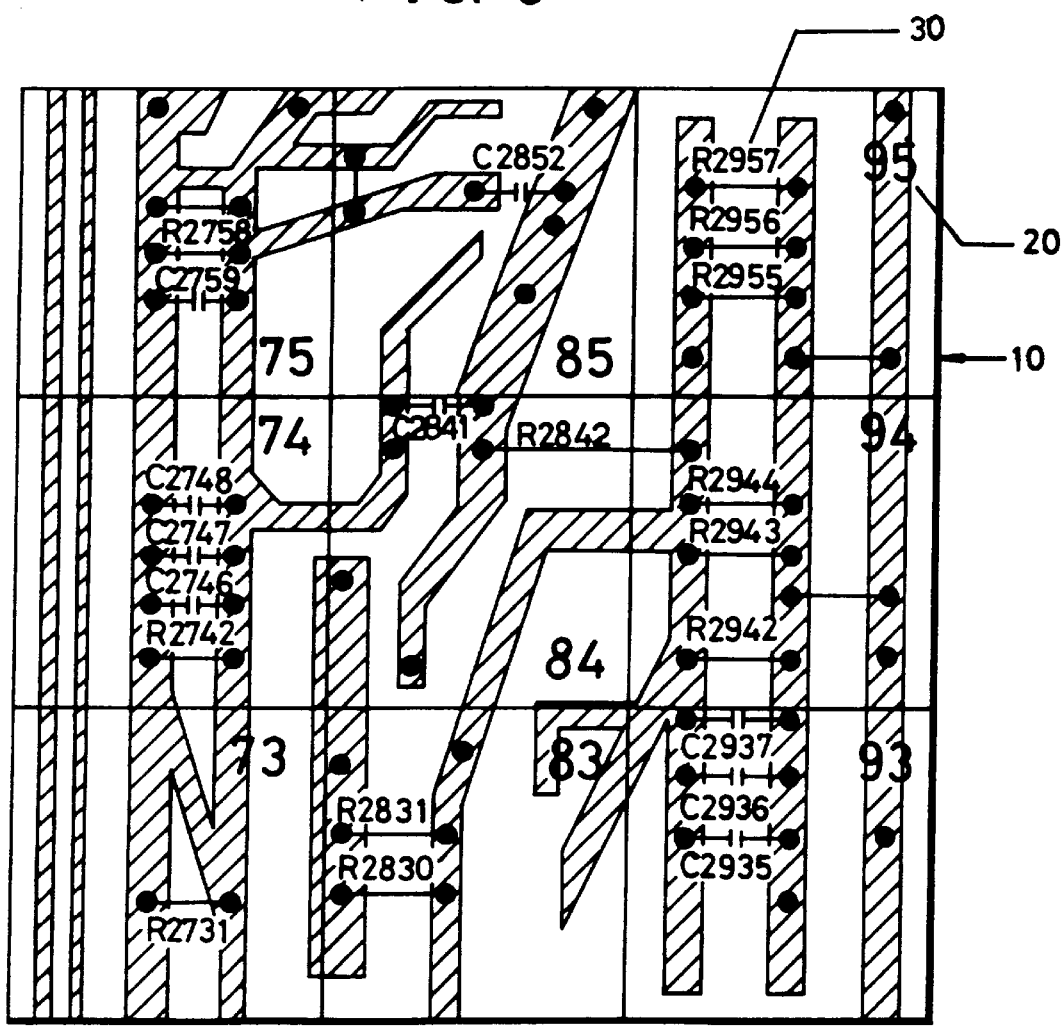

PRINTED CIRCUIT BOARD HAVING COORDINATE VALUES OF ELECTRONIC COMPONENTS TO BE MOUNTED THEREON AND A METHOD OF NUMBERING THE ELECTRONIC COMPONENTS THEREON

BACKGROUND OF THE INVENTION

1. Field of the Invention

The present invention generally relates to a printed circuit board (PCB). More particularly, the present invention relates to a PCB on which X-Y coordinate values of electronic components to be mounted thereon are printed, where the PCB is divided into a plurality of sections, and a method of numbering the electronic components to be mounted thereon with X-Y coordinate values.

2. Description of the Prior Art

Many electronic components are mounted on a PCB. Generally, a component's number is printed on the PCB next to the electronic component in order to easily identify the type and number of the electronic component. FIG. 1 shows a PCB on which electronic component numbers are printed. Referring to FIG. 1, electronic component numbers 2, representing a resistor, capacitor, coil, transistor integrated circuit, etc., are printed on the PCB 1.

The electronic component numbers printed on the PCB are determined by a board artworker. A resistor may be printed as R1, R2, R3, etc, and a capacitor as C1, C2, C3, etc. There are two conventional methods of numbering electronic components to be mounted on a PCB. According to one method, electronic component numbers are printed in series, i.e., beginning from the left corner and ending in the right corner of the PCB. According to the other method, the electronic component numbers which were determined by a circuit designer are printed on the PCB as they are, being next to the corresponding electronic components.

However, the above-described numbering methods have the following disadvantages:

According to the first-mentioned method, the electronic component numbers are newly determined and printed on the PCB in order, without following those numbers determined during the circuit design work, and thus have regular arrangements in their numerals. However, if some electronic components mounted on the PCB need to be added, deleted or changed due to the change of the circuit design or specification, their arrangement regularity will be broken easily.

According to the other method, the position of the electronic components mounted on the PCB is substantially different from that determined during the circuit design work, and thus their arrangements on the PCB will be very irregular.

If the electronic component numbers are irregularly arranged on the PCB, it will be difficult to identify a desired component according to its number printed on the PCB, causing the board artwork and board mounting as well as the repair work to be difficult and time-consuming.

SUMMARY OF THE INVENTION

The present invention is directed to solving the above-mentioned problems involved in the prior art. It is an object of the present invention to provide a PCB and a method of numbering the electronic components thereon by which one can easily identify a desired electronic component.

In one aspect of the present invention, there is provided a PCB which is divided into a plurality of sections having respective X-Y coordinate values, and on which the number of an electronic component is printed based on the X-Y coordinate values of the sections to which the electronic component belongs.

In another aspect of the present invention, there is provided a method of numbering electronic components to be mounted on a PCB, comprising the steps of:

dividing the PCB into a plurality of sections;

allocating X-Y coordinate values to each of the sections and printing the allocated X-Y coordinate values in each of the sections; and determining an electronic component number based on the allocated X-Y coordinate values of the section to which the electronic component belongs.

In the present invention, the electronic component number comprises the type and serial number of the electronic component, and the X-Y coordinate values of the section to which the electronic component belongs.

BRIEF DESCRIPTION OF THE DRAWINGS

The above object and other features of the present invention will become more apparent by describing the preferred embodiment thereof with reference to the accompanying drawings, in which:

FIG. 3 is a view illustrating a PCB on which electronic component numbers are printed according to the present invention, utilizing the X-Y coordinate plane of FIG. 2.

DETAILED DESCRIPTION OF THE PREFERRED EMBODIMENT

Figure 1:
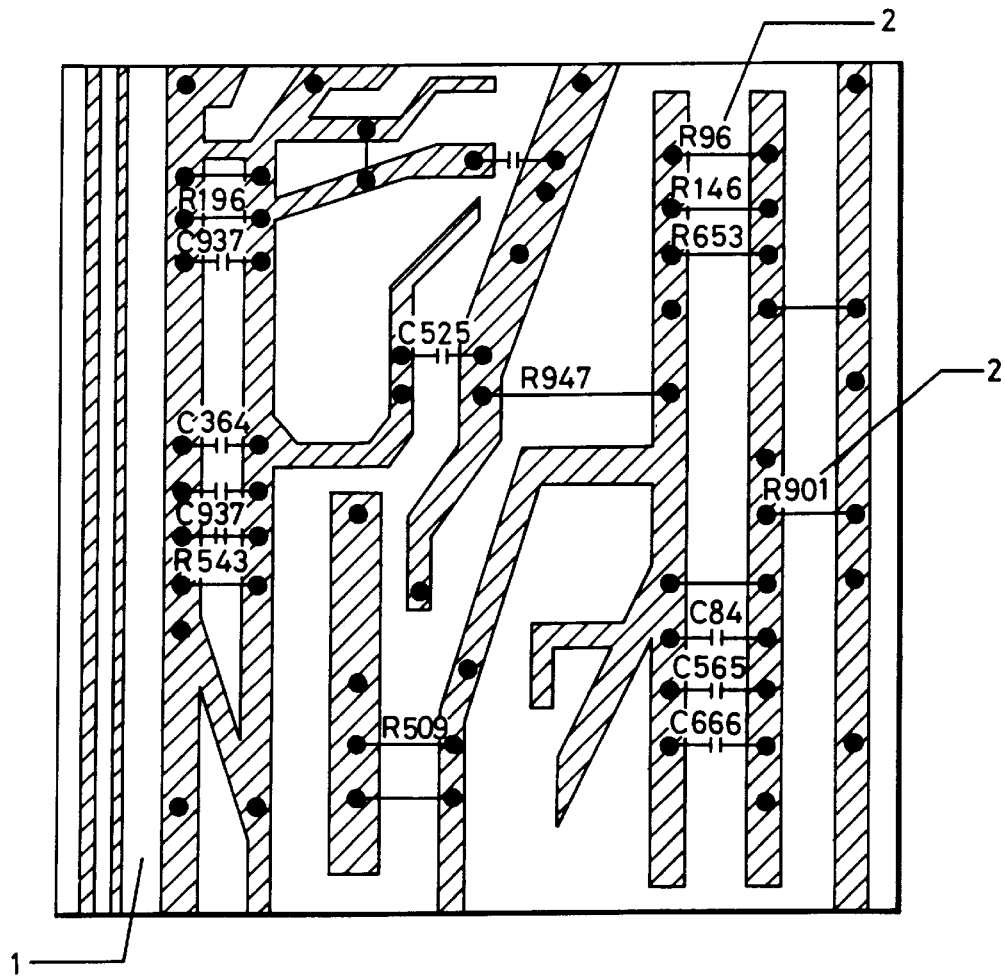
FIG. 1 is a view illustrating a PCB on which electronic component numbers are printed by a conventional method.
Figure 2:
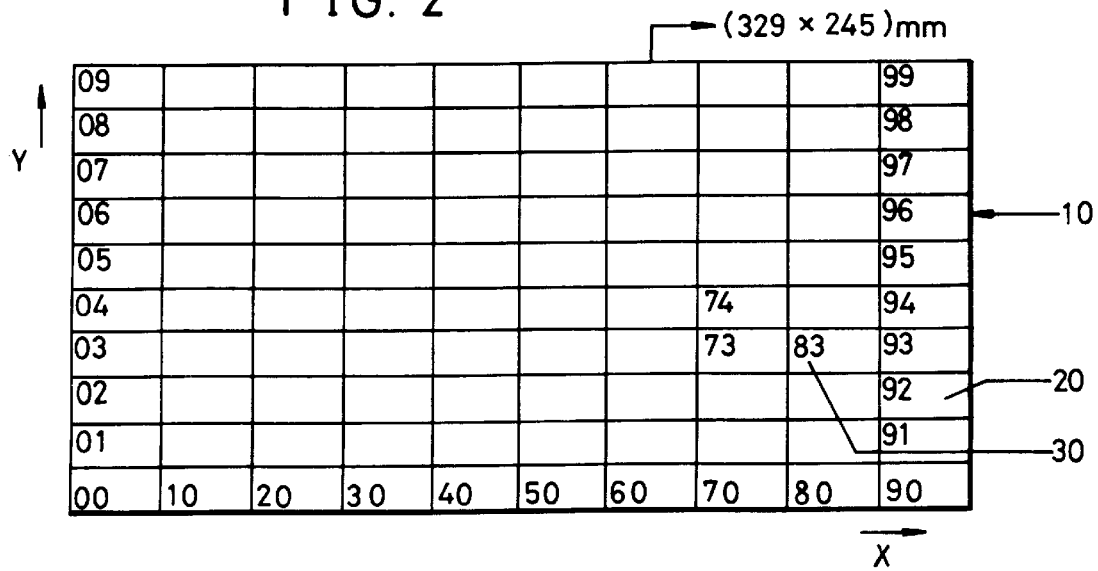
FIG. 2 is a view illustrating an X-Y coordinate plane which is divided into 100 sections having respective coordinate values according to present invention.

FIG. 2 shows an X-Y coordinate plane explaining the numbering method according to the present invention. Referring to FIG. 2, an X-Y coordinate plane 10 is divided in breadth and length to provide sections 20 allocated with respective X-Y coordinate values 30. In the embodiment of the present invention, the plane 10 is divided into 100 (i.e., 10×10) sections as shown in FIG. 2.

FIG. 3 shows a PCB on which electronic component numbers are printed in the X-Y coordinate plane of FIG. 2 according to the present invention. According to the present invention the number of each electronic component is given in a format of "type—classification —X coordinate—Y coordinate—serial number".

The numbering method according to the present invention will be explained, taking the electronic component number "R2957" as shown in FIG. 3 as an example. The first place of the number "R" represents the type of the electronic component, which is commonly used as an abbreviation of a resistor. The second place "2" represents the classification of the electronic component which can be determined at a board artworker's discretion.

For instance, the second place "2" may be determined to be an electronic component of a certain circuit such as a signal processing circuit, power supply, image processing circuit, sound processing circuit, etc.

The third and fourth places "95" represent X-Y coordinate values of the section 20 to which the electronic component belongs. In the embodiment, the PCB is divided into 100 sections, and thus one can easily find a desired section to which the electronic component belongs identifying the third and fourth places of the electronic component number.

The last place "7" represents the serial number of the electronic component which is given in series to each electronic components belonging to the same section of the PCB. In order to improve the identification for a board artworker or a repairman, the numeral or character of each place may differ from another in size, bold strokes, and color.

As described above, according to the present invention, a desired electronic component mounted on a PCB can be easily found by identifying the section to which the electronic component belongs with the classification and the X-Y coordinate values of the electronic component number even though the PCB has a high component integrity, thereby reducing the work and time required for board artwork, repair, and maintenance of the PCB. Further, in case that any electronic component is newly added, removed, or changed, numbering and identifying of the electronic components are not destroyed since the number of the added or changed electronic component is given or changed within the corresponding section of the PCB.

While the present invention has been described and illustrated herein with reference to the preferred embodiment thereof, it will be understood by those skilled in the art that various changes in form and details may be made therein without departing from the spirit and scope of the invention.

What is claimed is:

1. A printed circuit board divided into a plurality of sections by using an X-Y coordinate system for location identification, each section being allocated and printed with an X-Y coordinate value and identification markings of all electronic components mounted on said section, wherein each marking contains information that specifies a type of each component and the allocated X-Y coordinate value of the section to which each electronic component belongs.

2. A printed circuit board as claimed in claim 1, wherein each marking contains additional information that specifies a classification of the component and a serial number of the component.

3. A printed circuit board comprising:

a board member having a plurality of sections, each section being identified by an X-Y coordinate value and having a plurality of locations each location being associated with an electronic component to be attached thereto;

a plurality of first markings each representing the X-Y coordinate value of a corresponding section and being printed on the corresponding section; and a plurality of second markings each being printed adjacent to the location of the associated electric component to be attached and being in a format that specifies the X-Y coordinate value of the section to which the associate electronic component to be attached and a serial number of the electronic component to be attached.

4. The printed circuit board according to claim 3, wherein said format further specifies a type of the component to be attached and a classification of the component to be attached.

5. The printed circuit board according to claim 4, wherein the plurality of sections are uniform in area.

6. A method of numbering electronic components mounted on a printed circuit board, comprising the steps of:

dividing the printed circuit board into a plurality of sections;

allocating X-Y coordinate value to each of the sections and printing the allocated X-Y coordinate value in the section; and determining and printing identification markings in each section, wherein each marking is based on a type of each component and the allocated X-Y coordinate value of the section to which each of the electronic components belongs.

7. A method of installing electronic components as claimed in claim 6, wherein each marking is further based on a classification of each component and a serial number of the each component.

* * * * *